United States Patent
Dan et al.

(10) Patent No.: US 6,657,193 B2
(45) Date of Patent: Dec. 2, 2003

(54) SCANNING ELECTRON MICROSCOPE

(75) Inventors: Yukari Dan, Hitachinaka (JP);
Ryuichiro Tamochi, Hitachinaka (JP);
Mitsugu Sato, Hitachinaka (JP)

(73) Assignees: Hitachi High-Technologies Corporation, Tokyo (JP); Hitachi Science Systems, Ltd., Hitachinaka (JP)

( * ) Notice: Subject to any disclaimer, the term of this patent is extended or adjusted under 35 U.S.C. 154(b) by 0 days.

(21) Appl. No.: 10/274,029

(22) Filed: Oct. 21, 2002

(65) Prior Publication Data
US 2003/0080293 A1 May 1, 2003

(30) Foreign Application Priority Data
Oct. 25, 2001 (JP) ........................................ 2001-328036

(51) Int. Cl.[7] ............................................. H01J 37/252
(52) U.S. Cl. ...................................... 250/310; 250/397
(58) Field of Search .................................. 250/310, 397

(56) References Cited
U.S. PATENT DOCUMENTS
4,880,976 A * 11/1989 Mancuso et al. ........... 250/310

OTHER PUBLICATIONS

"A new detection technique for high pressure SEM", Paper presented at EUREM 88, York, England, 1988.

Specimen current detection for nonconducting materials in high pressure scanning electron microscopy (HPSEM), No Date.

* cited by examiner

Primary Examiner—Kiet T. Nguyen
(74) Attorney, Agent, or Firm—Dickstein Shapiro Morin & Oshinsky LLP

(57) ABSTRACT

A scanning electron microscope is provided which is capable of efficiently detecting ions, such as primary electron excitation ions, reflection electron excitation ions or secondary electron excitation ions caused by a bias electric field, thereby obtaining an absorption current. A scanning electron microscope irradiates an electron beam to a sample while keeping a sample chamber pressure at 1 Pa or higher, to detect generated ions and display a sample image. An ion detecting electrode is provided exclusively for detecting ions. The ion detecting electrode is arranged nearby a path for accelerating ions by a bias electrode.

5 Claims, 4 Drawing Sheets

SCANNING ELECTRON MICROSCOPE

BACKGROUND OF THE INVENTION

1. Field of the Invention

This invention relates to scanning electron microscopes and, more particularly, to a scanning electron microscope well suited for using a secondary electron detector of an absorption current scheme to absorb the ions generated by electron-beam irradiation in a state of high sample chamber pressure.

2. Description of the Related Art

It is a conventional practice to use an absorption current scheme in the scanning electron microscope having a variable sample chamber pressure wherein, in a state of high sample chamber pressure, the secondary electrons generated at a sample surface are accelerated by a positive bias electrode positioned in the above and bombarded against the gas molecules remaining in the sample chamber to generate ions so that the ions are absorbed at a sample table or stage positioned within the sample chamber to amplify and A/D-convert an absorption current signal thereby forming an image. Because the ions have secondary electron information, it is possible to obtain surface information of the sample. The positive bias voltage positioned above can be varied, with a 10-V step, from 0V to 300V. By changing the speed for accelerating the secondary electrons caused from the sample surface, it is possible to adjust the amount of ion generation. The generated ions are moved back toward the sample by an electric field formed between the sample and the bias voltage to be absorbed at the conductive sample table or stage positioned within the sample chamber.

In the meanwhile, it has been revealed that, in the conventional scanning electron microscope of an absorption current scheme, there is encountered a problem the amount of ion absorption decreases when an insulating sample in observation is large in size. Making consideration on the cause, it has been thought of forming a factor that the potential on a sample itself changes depending on an insulating sample size to cause a disturbance in the electric field formed between the bias electrodes thus changing the mobility of the ions within the sample chamber.

It is an object of the present invention to provide a scanning electron microscope capable of efficiently detecting ions, such as primary electron excitation ions, reflection electron excitation ions or secondary electron excitation ions caused by a bias electric field, thereby obtaining an absorption current.

SUMMARY OF THE INVENTION (1) In order to achieve the foregoing object, the present invention is provides a scanning electron microscope for irradiating an electron beam to a sample while keeping a sample chamber pressure at 1 Pa or higher to detect an generated ion and display a sample image, comprising an ion detecting electrode exclusive for detecting the ion.

This structure makes it possible to efficiently detect ions, such as primary electron excitation ions, reflection electron excitation ions or secondary electron excitation ions caused by a bias electric field, thereby obtaining an absorption current.

(2) In the above (1), preferably, the ion detecting electrode is arranged nearby a path for accelerating an ion by a bias electrode.

(3) In the above (2), preferably, the ion detecting electrode is fixed on and electrically connected to a sample table for holding the sample or to a sample stage supporting the sample table, the ion detecting electrode being variable in vertical length, further comprising control means for controlling such that a distance between an upper end of the ion detecting electrode and the bias electrode is constant.

(4) In the above (2), preferably, the ion detecting electrode is arranged distant from a sample table for holding the sample or from a sample stage supporting the sample table such that a distance between the bias electrode and an upper end of the ion detecting electrode is constant, the ion detecting electrode being variable in vertical length, further comprising control means for controlling such that a distance between a lower end of the ion detecting electrode and the sample is constant.

(5) In the above (4), preferably, voltage applying means is further provided for applying a voltage to the ion detecting electrode.

DETAILED DESCRIPTION OF THE PREFERRED EMBODIMENTS

Figure 1:
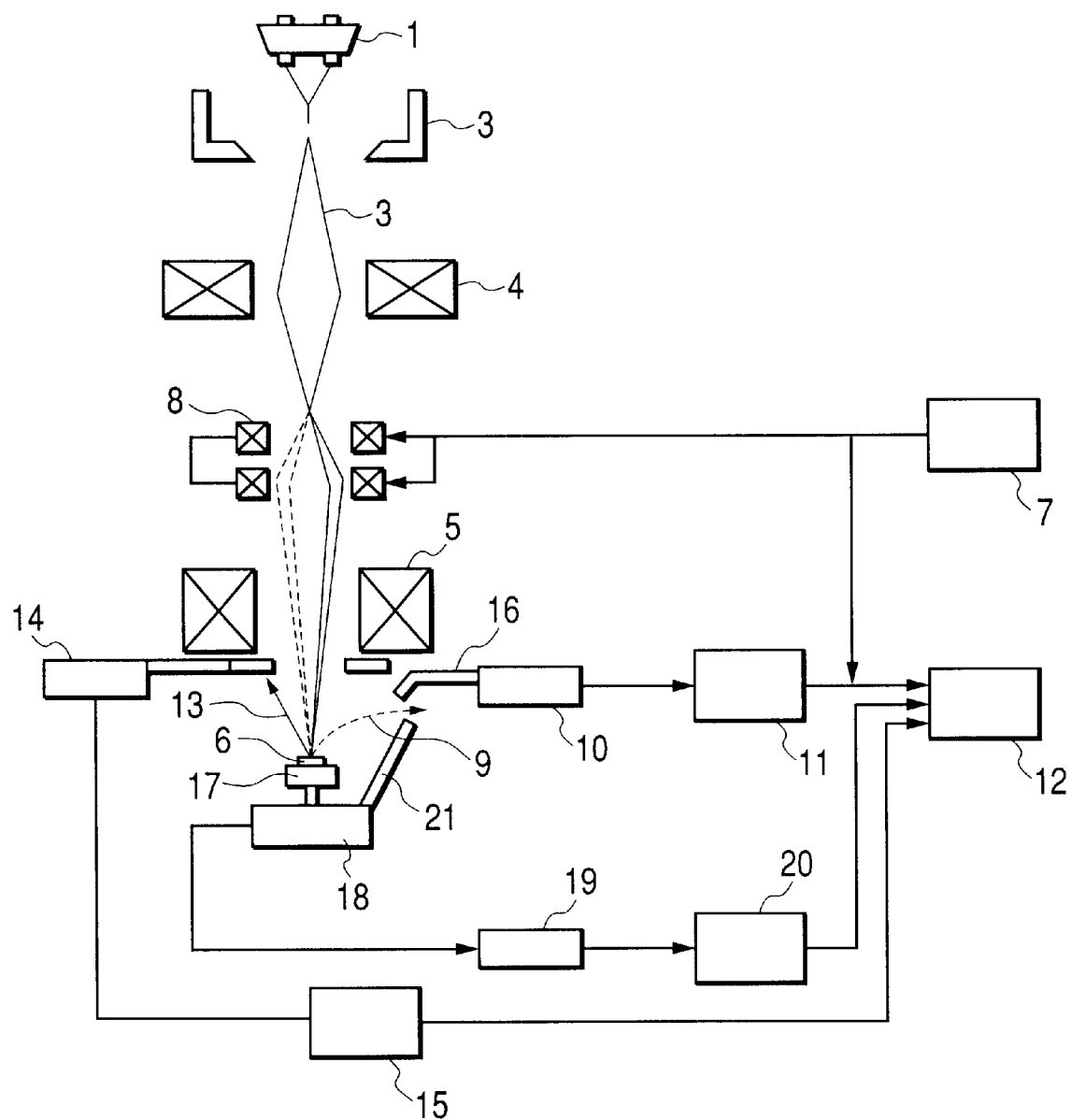
FIG. 1 is a block diagram showing an overall structure of a scanning electron microscope according to a first embodiment of the present invention.
Figure 2:
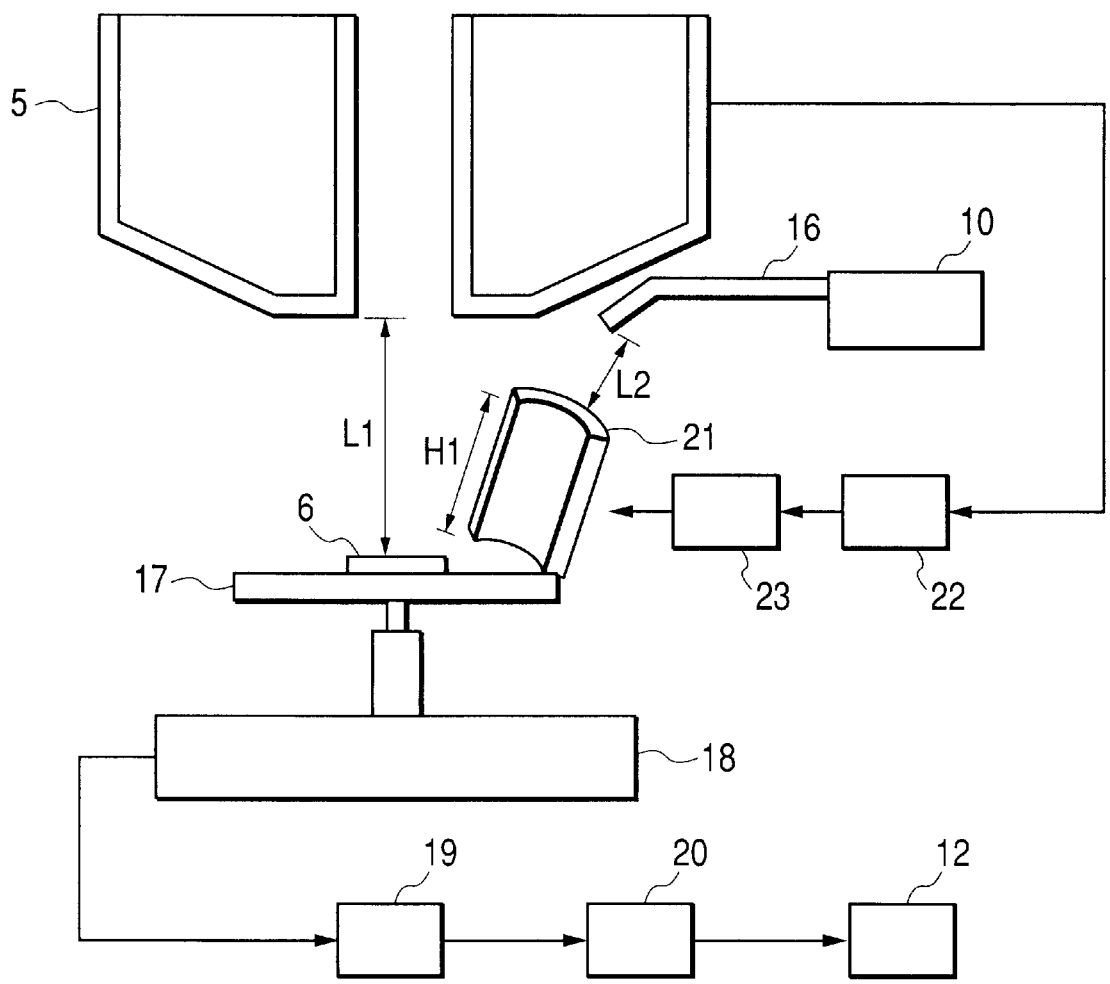
FIG. 2 is a block diagram showing a detailed structure of an ion detecting electrode used in the scanning electron microscope of the first embodiment of the invention.

Explanation will be now made on a structure of a scanning electron microscope according to a first embodiment of the invention, using FIGS. 1 and 2.

First explained is a structure of the scanning electron microscope of the present embodiment, using FIG. 1.

FIG. 1 is a block diagram showing the overall structure of the scanning electron microscope of the first embodiment of the invention.

A filament 1 is arranged in a high vacuum. The filament 1 uses, for example, a tungsten wire bent in a hairpin form. Applying an electric current to the filament 1 causes thermoelectrons to emit at a tip of the filament 1. The electrons emitted from the filament 1 are accelerated by an accelerator electrode 2 and formed into an electron beam 3. The voltage to be applied to the accelerator electrode 2 is 30 kV or lower, for example. The electron beam 3 is narrowed down by a capacitor lens 4 and objective lens 5 and then irradiated onto a sample 6. By controlling the current fed to a deflection coil 8, the electron beam 3 is scanned in X-Y two dimensions. The scanning distance by the deflection coil 8 is controlled by a computer 7.

In a state of low sample chamber pressure, e.g. $10^{-3}$ Pa, the secondary electron 9 caused from the sample 6 by electron beam irradiation is detected in a secondary electron detector 10, and voltage-converted and amplified by an amplifier (not shown). This is thereafter turned into a digital signal by an A/D converter 11 and then image-displayed on a display 12.

In the case of observing a non-conductive sample, the sample chamber is made in a high pressure state, e.g. 1–270

Pa. In the state of high sample chamber pressure, the electron beam 3, prior to irradiation to the sample 6, bombards the gas molecules remaining in the sample chamber to ionize the gas molecules. Although there is observed a phenomenon the electron beam 3 irradiated to a nonconductive sample 6 causes an electrification on a surface of the sample 6, the gas molecules ionized due to bombardment by the electron beam 3 prior to irradiation to the sample 6 neutralize the electrified electrons on the surface of the sample 6. This decreases the electrification phenomenon on the surface of the sample 6. On this occasion, generally, the reflected electrons 13 generated from the sample 6 are gained by a reflected electron detector 14 positioned in the above and amplified by an amplifier (not shown), and then converted into a digital signal by an A/D converter 15 whereby a reflected electron image is displayed on the display 12.

In a state of high sample chamber pressure, the secondary electron 9 generated at the surface of the sample 6 has a mean free path as short as 10 mm at a sample chamber vacuum degree of 13 Pa and 0.5 mm at 270 Pa. Accordingly, the secondary electron is impeded by the gas molecules remaining in the sample chamber possibly not to reach the secondary electron detector 10, thus resulting in impossibility to obtain information. For this reason, in order to obtain secondary electron information, a positive voltage (–300V) is applied to a bias electrode 16 positioned at a tip of the secondary electron detector 10, whereby the secondary electron 9 generated at the surface of the sample 6 is accelerated and bombarded against the gas molecules remaining in the sample chamber to thereby cause ions. The generated ions are moved toward the sample by the electric field formed between the sample 6 and the bias electrode 16, and then detected as an absorption current by an absorption-current-schemed secondary electron detector 19 through a conductive sample table 17 or conductive sample stage 18. The absorption-current signal is amplified by an amplifier (not shown) and turned into a digital signal by an A/D converter 20, then being displayed as an image on a display 12.

This embodiment is provided, furthermore, with an ion detecting electrode 21. The ion detecting electrode 21 is formed of a conductive material of aluminum, copper or the like. The ion detecting electrode 21 is electrically connected and attached to the sample table 17. Meanwhile, the ion detecting electrode 21 is arranged nearby a path for accelerating ions by the bias electrode 16. Moving ions are not only absorbed by the sample table 17 or sample stage 18 but also detected by the ion detecting electrode 21 arranged close to the ion acceleration path. As a result, when a large-sized insulating sample is put on the sample table 17, even where the potential on the sample itself is changed to cause a disturbance in an electric field caused between the bias electrodes to change the ion mobility within the sample chamber, it is possible to effectively absorb an ion current and hence obtain an absorption current. Incidentally, the detail of the ion detecting electrode 21 will be referred later using FIG. 2.

Explanation will be now made on the detailed structure of the ion detecting electrode 21 for use in the scanning electron microscope according to this embodiment, using FIG. 2.

FIG. 2 is a block diagram showing a detailed structure of the ion detecting electrode 21 for use in the scanning electron microscope of a first embodiment of the invention. Note that the reference numerals same as those of FIG. 1 designate the same elements.

The ion detecting electrode 21 is a conductive plate member having a bellows structure. The ion detecting electrode 21 is arranged obliquely nearby an ion acceleration path, i.e. ion generating passage, at between the sample 6 and the bias electrode 16. The ion detecting electrode 21, at its bottom, is contacted and electrically connected with the conductive sample table 17. Incidentally, the ion detecting electrode 21 can use a conductor rod in place of the plate member. The ion detecting electrode 21, having a bellows structure, can be varied in vertical height H1. A motor drive circuit 23 is provided to change the vertical height H1 of the ion detecting electrode 21.

The distance between the objective lens 5 and the sample, i.e. a working distance L1, can be generally changed depending upon a state of observation. In the case the working distance L1 is taken, e.g., 10 mm when observing a secondary electron image, the working distance L1 is provided, e.g., 15 mm upon conducting an X-ray analysis. It has been revealed that, where observing a secondary electron image while conducting an X-ray analysis by changing the working distance L1 from 10 mm to 15 mm in this manner, the secondary electron image is displayed dark on the display 12. As a result of consideration on its cause, by increasing the working distance L1, the electric field by the bias electrodes is weakened to decrease the ion current to be detected by the ion detecting electrode 21. Consequently, when the height H1 of the ion detecting electrode 21 has been changed to make constant a distance L2 between the bias electrode 16 and the upper end of the ion detecting electrode 21 even where the working distance L1 has been changed, the ion current has been prevented from decreasing. Accordingly, in this embodiment, the height H1 of the ion detecting electrode 21 is controlled depending upon a working distance L1 by the motor drive circuit 23, thereby keeping constant the distance L2 between the bias electrode 16 and the upper end of the ion detecting electrode 21.

For this reason, a focus-current reading circuit 22 acquires a distance L1 of between the objective lens 5 and the sample 6 from a focus current on the objective lens 5. When there is a change in the distance L1 of between the objective lens 5 and the sample 6 acquired by the focus-current reading circuit 22, the motor drive circuit 23 vertically expands and contracts the ion detecting electrode 21 such that the distance L2 of between the tip of the ion detecting electrode 21 and the bias electrode 16 is constant, thereby automatically changing the height H1.

The absorption current acquired from the ion detecting electrode 21 can be detected from the absorption-current-schemed secondary electron detector 19 because of direct contact with the sample table 17 or sample stage 18. This can be displayed, in addition to the absorption-current information in current situation, on the display 12.

Incidentally, the distance L2 between the bias electrode 16 and the ion detecting electrode 21 can be set to an arbitrary distance by inputting numerals. Meanwhile, there is provided a knob which can vertically change the shape of the ion detecting electrode 21 even manually when the motor drive circuit 23 is off. Furthermore, distance setting of between the ion detecting electrode 21 and the bias electrode 16 can be used linked to the sample stage 18 under control of an auto-motor. The ion detecting electrode 21 has a left-right shape in a bellows structure so that an ion detecting area can be increased by manually changing the shape with using the knob.

The ion detecting electrode 21 may be arranged not on the sample table 17 but on the sample stage 18.

As explained above, according to this embodiment, by providing an ion detecting electrode 21 nearby the ion acceleration path, an ion current can be efficiently detected to obtain an absorption current. Also, even where the working distance L1 changes, the ion current can be prevented from decreasing by changing the height H1 of the ion detecting electrode 21 to control constant the distance L2 of between the bias electrode 16 and the ion detecting electrode 21.

Figure 3:
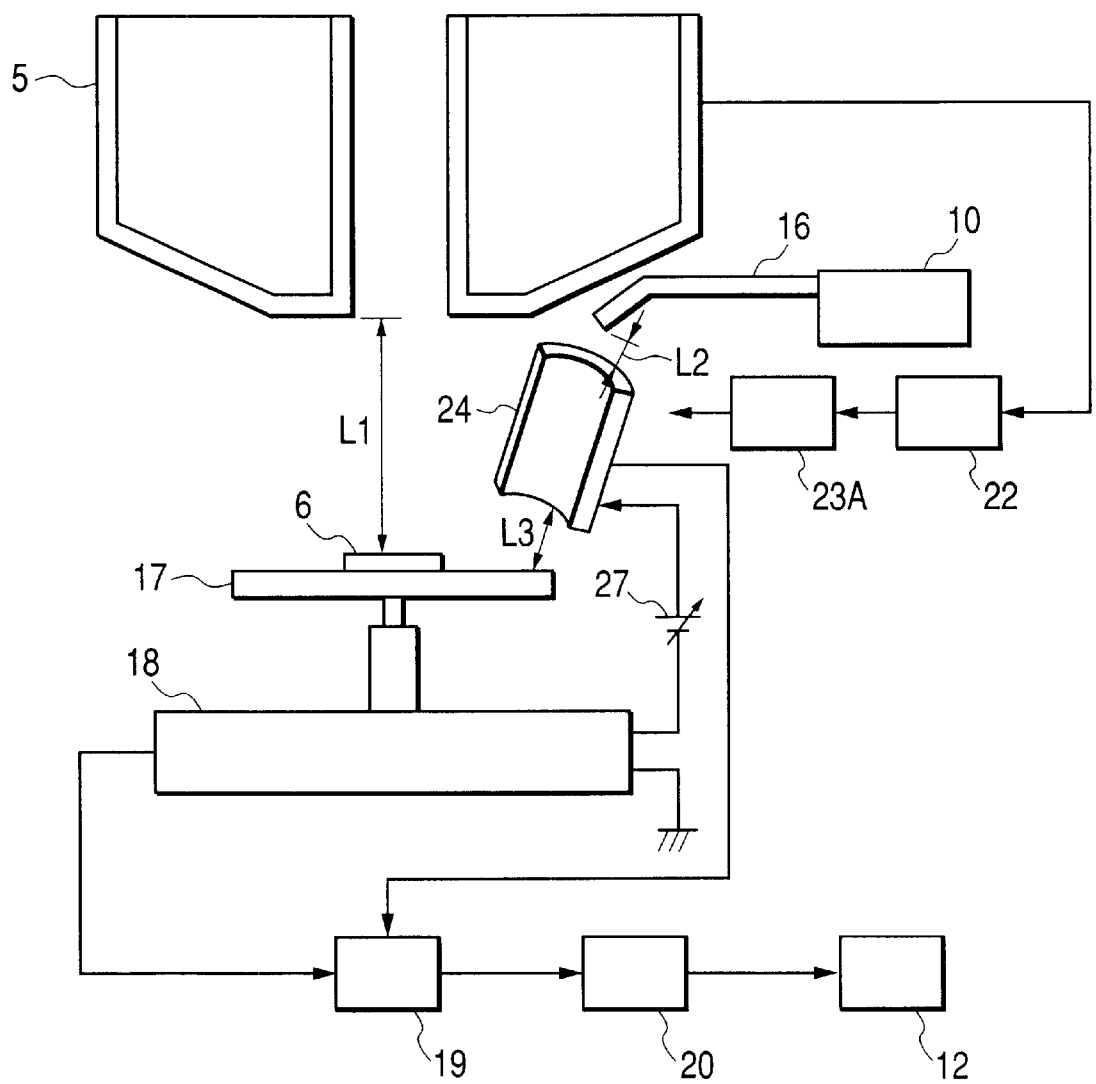
FIG. 3 is a block diagram showing a detailed structure of an ion detecting electrode used in a scanning electron microscope of a second embodiment of the invention.

Explanation will be now made on a structure of a scanning electron microscope according to a second embodiment of the invention, by using FIG. 3. Note that the overall structure of the scanning electron microscope of this embodiment is similar to that shown in FIG. 1.

FIG. 3 is a block diagram showing a detailed structure of an ion detecting electrode 21 for use in the scanning electron microscope of the second embodiment of the invention. Incidentally, the same references as those of FIGS. 1 and 2 designate the same elements.

In this embodiment, an external ion detecting electrodes 24 is not electrically connected to a sample table 17 but is provided independently. The external ion detecting electrode 24 is provided on an ion generation path between the sample 6 and the bias electrode 16, which is in such a form as a conductor bar or plate-formed saucer. The distance L2 between the bias electrode 6 and an upper end of the external ion detecting electrode 24 is constant. Also, the external ion detecting electrode 24 has a left-right shape in a bellows structure, having a mechanism to change the ion detecting area by a knob for freely changing the form.

A focus-current reading circuit 22 can confirm a position of a sample 6 from a focus current on the objective lens 5. A motor drive circuit 23A varies a lengthwise shape of the external ion detecting electrode 24 such that the distance L3 between a lower end of the external ion detecting electrode 24 and the sample 6 is constant, depending upon a sample position detected by the focus-current reading circuit 22. There is provided a knob which can manually change the form of the external ion detecting electrode 24 when the motor drive circuit 23A is off.

The signal obtained from the external ion detecting electrode 24 is sent to an absorption-current-schemed secondary electron detector 19, and displayed as an image, in addition to absorption-current information obtained from the conventional sample table 17 or sample stage 18, on the display 12.

Incidentally, switch means can be provided between the external ion detecting electrode 24 and the secondary electron detector 19, to turn on and off the input of information from the external ion detecting electrode 24 to the secondary electron detector 19. For example, in the case of a small amount of secondary electrons, e.g. with a carbon or polymer film, the switch means can be turned on to increase the absorption current. In the case of a large amount of secondary electrons, e.g. with alumina, the switch means can be turned on to prevent the absorption current from excessively increasing.

Also, a variable voltage source 27 is provided to apply a voltage to the ion detecting electrode 24 relative to the sample stage 18 when the sample stage 18 is at a ground potential. By changing the voltage of the variable voltage source 27, it is possible to change the quality of the information obtained from the sample 6.

As explained above, the present embodiment is provided with an ion detecting electrode 24 nearby the ion acceleration path thereby efficiently detecting an ion current and obtaining an absorption current. Meanwhile, even where the working distance L1 is changed, the height H of the ion detecting electrode 24 can be changed to prevent the decrease of ion current. Furthermore, because there is no contact between the ion detecting electrode 24 and the sample table 6, the present embodiment can be applied for a case the sample is large in size.

Figure 4:
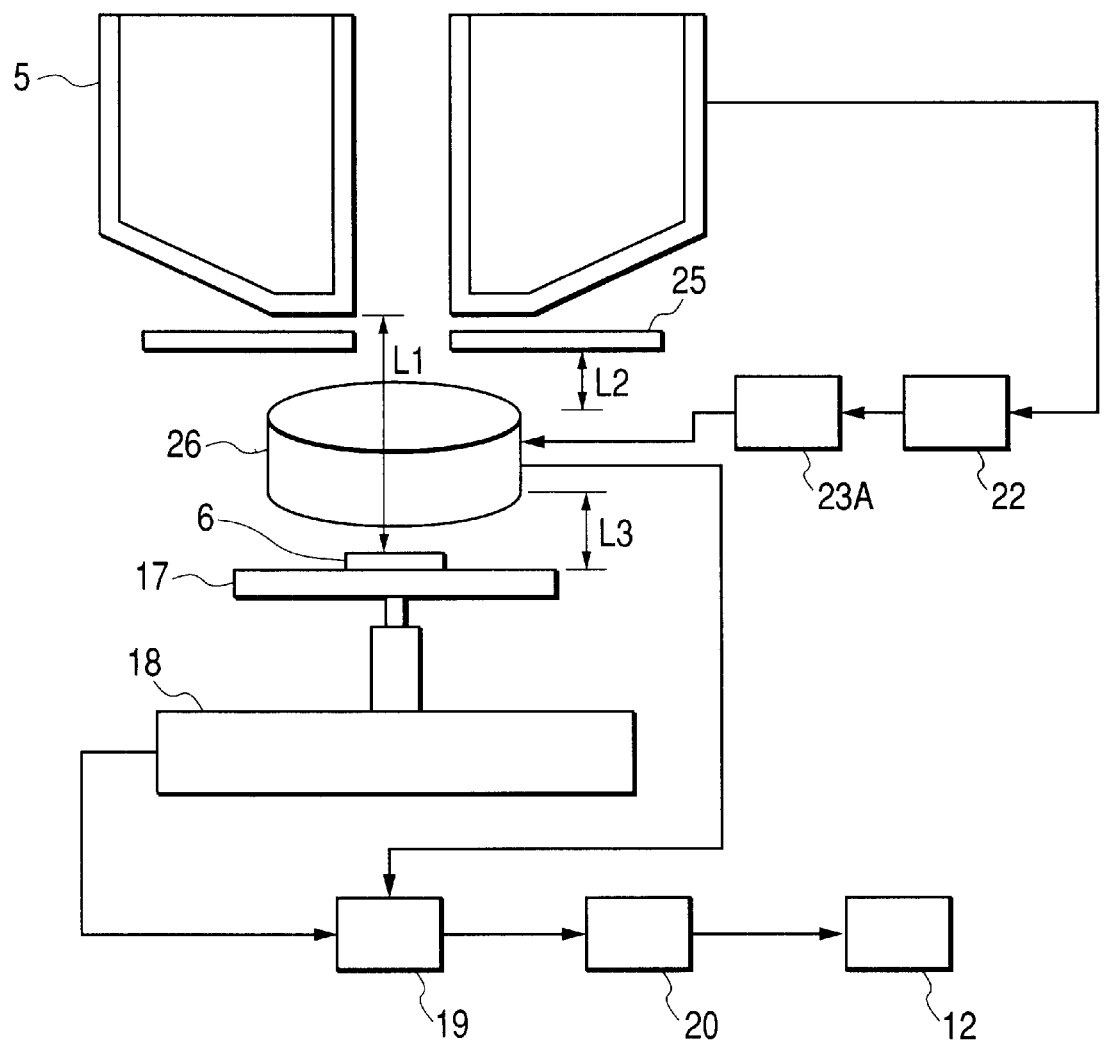
FIG. 4 is a block diagram showing a detailed structure of an ion detecting electrode used in a scanning electron microscope of a third embodiment of the invention.

Explanation will be now made on a structure of a scanning electron microscope according to a third embodiment of the invention, by using FIG. 4. Note that the overall structure of the scanning electron microscope of this embodiment is similar to that shown in FIG. 1.

FIG. 4 is a block diagram showing a detailed structure of an ion detecting electrode 21 for use in the scanning electron microscope of the third embodiment of the invention. Incidentally, the same references as those of FIGS. 1 and 2 designate the same elements.

In this embodiment, a bias electrode 25 is in a disc form. Consequently, an ion detecting electrode 26 is in a cylindrical form to surround a sample 6. The distance L2 is constant between an upper end of the ion detecting electrode 26 and the bias electrode 25. In the case of changing a working distance L1, the motor drive circuit 23A changes the shape of the ion detecting electrode 24 such that the distance L3 between the sample 6 and the lower end of the ion detecting electrode 26 is constant.

Incidentally, as explained in FIG. 3, switch means can be provided between the external ion detecting electrode 26 and the secondary electron detector 19 to turn on and off the input of information from the external ion detecting electrode 26 to the secondary electron detector 19. Also, a variable voltage source can be provided to apply a voltage to the ion detecting electrode 26 relative to the sample stage 18 so that the quality of the information obtained from the sample 6 can be changed by changing the voltage by the variable voltage source.

As explained above, according to the present embodiment, by providing an ion detecting electrode 26 nearby the ion acceleration path, an ion current can be detected with efficiency to obtain an absorption current. Also, in the case the working distance L1 is changed, the height H of the ion detecting electrode 26 can be changed to prevent an ion current from decreasing.

According to the present invention, it is possible to efficiently detect ions, such as primary electron excitation ions, reflection electron excitation ions or secondary electron excitation ions caused by a bias electric field, thereby obtaining an absorption current.

What is claimed is:

1. A scanning electron microscope for irradiating an electron beam to a sample while keeping a sample chamber pressure at 1 Pa or higher, to detect an generated ion and display a sample image, comprising:

an ion detecting electrode exclusive for detecting the ion.

2. A scanning electron microscope according to claim 1, wherein the ion detecting electrode is arranged nearby a path for accelerating an ion by a bias electrode.

3. A scanning electron microscope according to claim 2, wherein the ion detecting electrode is fixed on and electrically connected to a sample table for holding the sample or to a sample stage supporting the sample table, the ion detecting electrode being variable in vertical length, further comprising control means for controlling such that a distance between an upper end of the ion detecting electrode and the bias electrode is constant.

4. A scanning electron microscope according to claim 2, wherein the ion detecting electrode is arranged distant from a sample table for holding the sample or from a sample stage supporting the sample table such that a distance between the bias electrode and an upper end of the ion detecting electrode is constant, the ion detecting electrode being variable in vertical length, further comprising control means for controlling such that a distance between a lower end of the ion detecting electrode and the sample is constant.

5. A scanning electron microscope according to claim 4, further comprising voltage applying means for applying a voltage to the ion detecting electrode.

* * * * *